United States Patent [19]
Owen, III

[11] 4,026,740
[45] May 31, 1977

[54] PROCESS FOR FABRICATING NARROW POLYCRYSTALLINE SILICON MEMBERS

[75] Inventor: William H. Owen, III, Sunnyvale, Calif.

[73] Assignee: Intel Corporation, Santa Clara, Calif.

[22] Filed: Oct. 29, 1975

[21] Appl. No.: 626,855

[52] U.S. Cl. .................. 156/628; 29/580; 148/187; 156/657; 156/662

[51] Int. Cl.² .......................... H01L 21/312

[58] Field of Search ........... 156/3, 7, 8, 11, 13, 156/17; 148/186, 187; 29/580, 571

[56] References Cited
UNITED STATES PATENTS

| | | | |
|---|---|---|---|
| 3,460,007 | 8/1969 | Scott | 357/59 |
| 3,600,651 | 8/1971 | Duncan | 357/59 |
| 3,721,593 | 3/1973 | Hays et al. | 156/17 |
| 3,750,268 | 8/1973 | Wang | 29/571 |
| 3,817,794 | 6/1974 | Beadle et al. | 148/187 |
| 3,829,335 | 8/1974 | Allison et al. | 148/187 |
| 3,940,288 | 2/1976 | Tagagi et al. | 148/187 |

Primary Examiner—Charles E. Van Horn
Assistant Examiner—Jerome W. Massie
Attorney, Agent, or Firm—Blakely, Sokoloff, Taylor & Zafman

[57] ABSTRACT

A process for fabricating narrow silicon members from a polycrystalline silicon layer, such as gates for MOS field-effect transistors. The edge of a mask is used to define a gap which exposes a narrow line on the underlying silicon layer. A doped region is formed in the silicon layer through the gap and then the layer is selectively etched. The critical dimensions of the fabricated silicon members are determined by the extent of diffusion of the dopant and are substantially independent of masking tolerances.

14 Claims, 8 Drawing Figures

PROCESS FOR FABRICATING NARROW POLYCRYSTALLINE SILICON MEMBERS

BACKGROUND OF THE INVENTION

1. Field of the Invention

The invention relates to the fabrication of polycrystalline silicon members for MOS circuits, or the like.

2. Prior Art

In the fabrication of integrated circuits, particularly metal-oxide-semiconductor (MOS) silicon gate devices there is a requirement for forming narrow polycrystalline silicon members such as gates for field-effect transistors, interconnecting lines, and others. Narrower silicon structures permit higher density fabrication and in the case of silicon gate field-effect transistors provide improved performance. By way of example, with current high production processes, silicon gates are typically 6 microns wide.

A major factor preventing a substantial reducing in gate widths (or the dimensions of other polycrystalline silicon members) is the tolerances inherent in current production masks. The shifting of the critical dimensions from a mask to the final member (such as by etching) also adds to the masking tolerances, however to a lesser extent particularly where selective etchants are employed. While more expensive fabrication techniques are known (such as electron beam photolithography) typical tolerances (masking and etching) for high production fabrication of silicon members are ±0.7 to ±1.0 microns, with the masking tolerance accounting for approximately ±0.5 microns of this total. Thus, reliance on a mask for a critical dimension severely limits the fabrication of narrow members, that is, members less than a few microns.

The disclosed process does not use a mask to define critical dimensions. Rather the edge of a masking member is employed to form a gap or line opening. The critical dimensions, however, are controlled by a diffusion step. Thus, the resultant silicon structure is independent of the masking tolerances.

SUMMARY OF THE INVENTION

A process for fabricating a polycrystalline silicon structure from a layer of polycrystalline silicon is disclosed. A masking means is first formed on the polycrystalling silicon layer. An edge of this masking means is used to expose a predetermined portion of the silicon layer. A region of the silicon layer is doped through this exposed portion such that a doped region is formed in the silicon layer, adjacent to undoped polycrystalline silicon. The silicon layer is then subjected to an etchant which discriminates between doped and undoped silicon in order to remove the undoped silicon, thereby forming the silicon structure. The critical dimensions of this structure are substantially controlled by the extent of the doping in the silicon layer and are substantially independent of the masking tolerances.

DETAILED DESCRIPTION OF THE INVENTION

A process and method are disclosed for fabricating a polycrystalline silicon structure from a polycrystalline silicon layer. The disclosed process is particularly adaptable for the fabrication of circuit elements and members for MOS integrated circuits; for example, silicon gates, interconnecting lines, capacitors and others. Some of the disclosed details relate to the formation of silicon gates for field-effect transistors, these details are included to provide a better understanding of the invented process. However, it will be apparent to one skilled in the art that the process is adaptable for use on a plurality of other circuit elements and members.

In FIGS. 1 through 8 only a portion of a silicon substrate or "chip" is shown. Other fabrication may occur on other areas of the substrate, hence reference to the word "layer," or the like, in this disclosure does not imply that the layer covers the entire substrate surface, but rather may be isolated to portions of the substrate. Moreover, other fabrication occurring on the substrate may introduce, by way of example, oxide layers, over the entire surface of the substrate. It will be apparent to one skilled in the art that such oxide layers, or the like, may alter the disclosed process, however, such alterations when necessary will be apparent. Other deviations from the following description will also be apparent to one skilled in the art.

Figure 1:
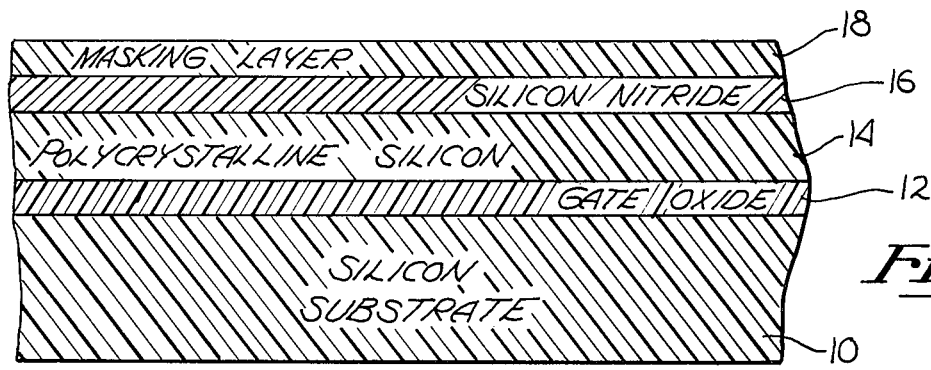
FIG. 1 is a cross-sectional partial elevation view of a silicon substrate which includes an gate oxide layer, polycrystalline silicon layer, silicon nitride layer and masking layer disposed on the upper surface of the substrate.
Figure 2:
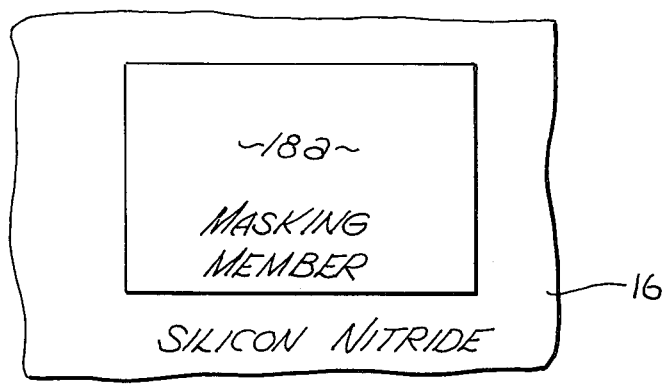
FIG. 2 is a partial plan view of a portion of the substrate of FIG. 1 with the masking layer etched to define a masking member.
Figure 3:
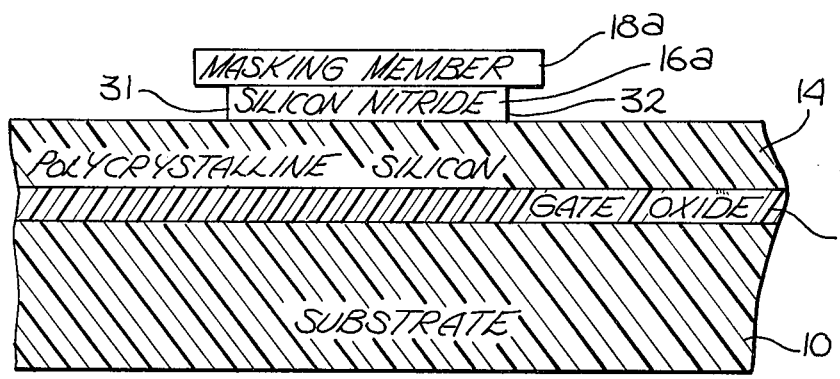
FIG. 3 is a cross-sectional elevation view of the substrate of FIG. 2 with the silicon nitride layer etched to form a masking member.

Referring first to FIG. 1 a silicon substrate 10 is shown with a gate oxide layer 12 (e.g. $SiO_2$, $SiO$) disposed on the upper surface of the substrate. A polycrystalline silicon layer 14 is formed on the upper surface of oxide layer 12 with a silicon nitride ($Si_3N_4$) layer 16 formed on the upper surface of the silicon layer 14. A oxide masking layer 18 is disposed on the upper surface of the silicon nitride layer 18. The layer 18 is used to form a masking member for etching the silicon nitride layer 16, hence other known masking methods may be employed.

The layers 12, 14, 16 and 18 may be fabricated by known processes. By way of example, layer 12 may be between 500–1000A thick, layer 14 may be approximately 4500A thick, layer 16 may be between 1000'λ '3000A thick and layer 18 may be approximately 200A thick.

A masking member 18a (FIG. 2) is formed from the oxide masking layer 18 by standard photolithographic techniques. This masking member may conform to any desired predetermined pattern. Then with an etchant such as one including hydrofluoric acid, a second masking member 16a (FIG. 3) of silicon nitride is etched from layer 16. Two edges of this second masking member 16a (edges 30 and 31) are shown; as will be described these edges are used to define a slot for doping regions of the underlying silicon layer 14.

Figure 4:
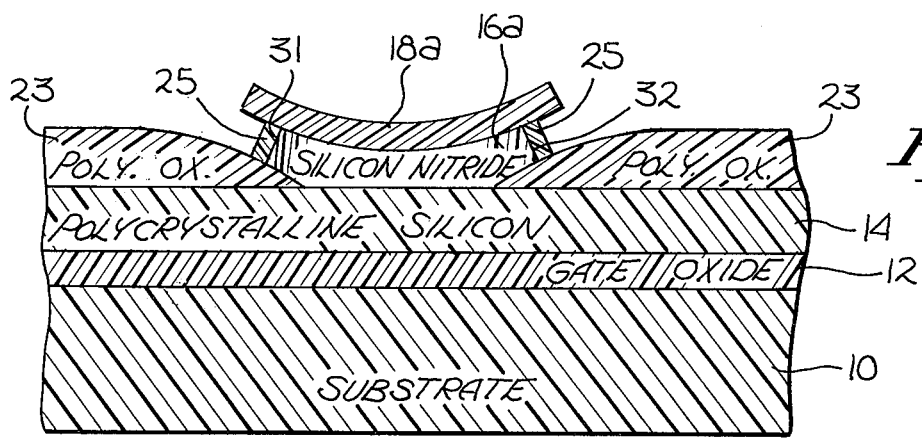
FIG. 4 illustrates the substrate of FIG. 3 with a silicon oxide layer disposed on the upper surface of the polycrystalline silicon layer.

Following the etching of the second masking member 16a, a silicon oxide is grown on the silicon layer 14. This oxide is shown as (Poly. Ox.) layer 23. This oxide layer grows more slowly at the edges 31 and 32 of member 16a, however, as shown in FIG. 4 this oxide layer extends beneath edges 31 and 32, although with an ever decreasing thickness. This oxide layer may be approximately 1000A thick at its thickest point. Also an oxide 25 developes at the edges 31 and 32 of the silicon nitride member 16a. This oxide 25 is relatively thin (30–50A) when compared to the oxide layer 23.

Next, the oxide 25 is removed. This may be accomplished by a buffered hydrofluoric acid dip (for example, a 10 second dip). Since the oxide layer 23 is much thicker than oxide 25, it is substantially unaffected by the removal of oxide 25.

Figure 5:
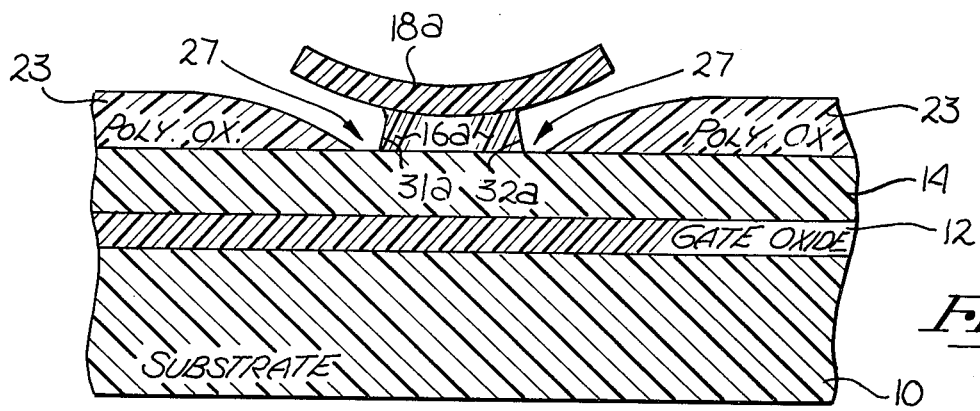
FIG. 5 illustrates the substrate of FIG. 4 with a gap formed between the silicon nitride masking member and the silicon oxide layer.

Following removal of the oxide 25 the silicon nitride masking member 16a is etched with a known silicon nitride etchant such as hot phosphoric ($H_2PO_4$) forming edges 31a and 32a (FIG. 5).

Figure 6:
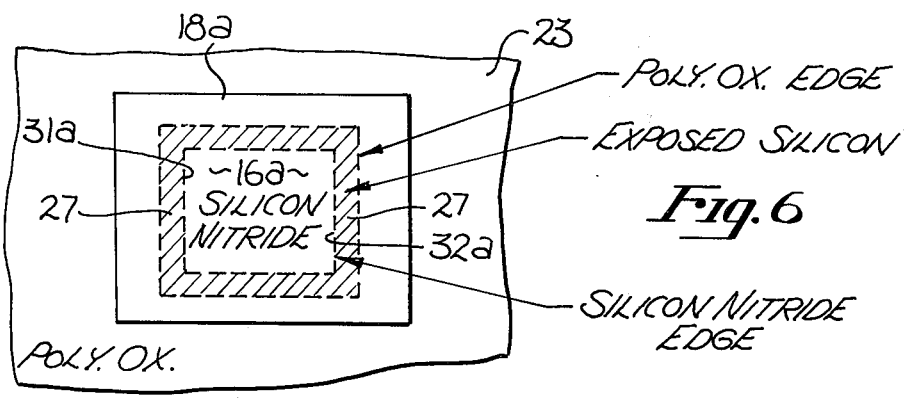
FIG. 6 is a partial plan elevation view of the substrate of FIG. 5.

The edges 31a and 32a of the silicon nitride masking member 16a along with the edges of the oxide layer 23 define a gap 27 shown in FIG. 5. Referring briefly to FIG. 6 this gap is a generally rectangular line (of narrow width) defined between the silicon nitride masking member 16a and the oxide layer 23. The gap 27 communicates with the polycrystalline silicon layer 14 since this layer is exposed when the silicon nitride is etched. The width of the gap 27 for the described embodiment is approximately 0.1 to 0.2 microns. This width may be readily obtained with known techniques since the hot phosphoric etching (or other etchant employed for etching the silicon nitride) is sufficiently controllable to achieve this tolerance.

Thus, the silicon nitride layer along with the oxide layer 23 comprise a masking means for forming a gap (or narrow line), which gap or line exposes a portion of the underlying polycrystalline silicon layer 14.

Figure 7:
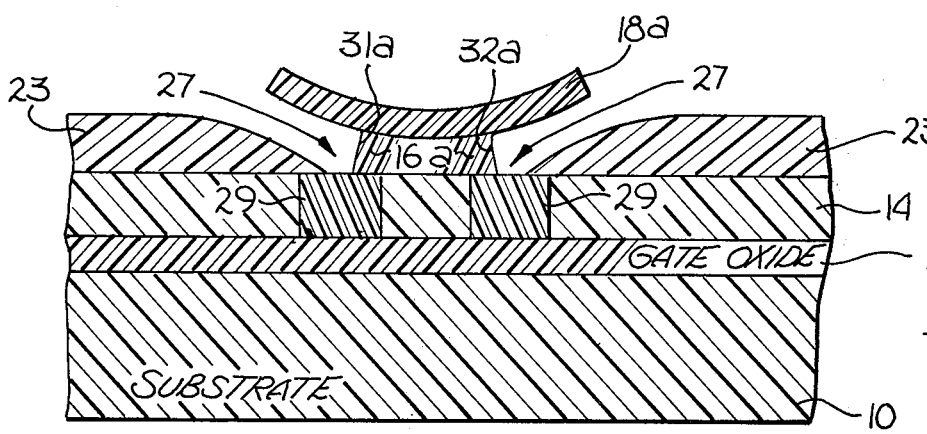
FIG. 7 is a cross-sectional elevation view of the substrate of FIGS. 5 and 6 with an impurity diffused into the polycrystalline silicon layer through the gap.

After the formation of the gap 27, the polycrystalline silicon layer 14 is doped with a boron dopant through the gap 27 to form the generally rectangular, doped region 29 shown in FIG. 7. By way of example, this boron doping may be performed in a boron predeposition furnace employing B $Br_3$ at approximately 1020° C. An oxidation driver step may also be employed, if desired. The extent of the boron diffusion into the polycrystalline silicon layer is readily controllable by known techniques, for example, by controlling the length of time during which the substrate remains in the furnace. The extent of this diffusion is used to determine the critical dimension of the desired silicon structure. For the described embodiment the doped region 29 is approximately 2 microns in width. The gap acts as a line source for the boron impurity, thus the width of the region 29 is substantially a function of the diffusion and not of the gap width. Thus, the doped region 29, by way of example, may be as narrow as 0.5 microns for the above described masking means.

Following the formation of the doped region 29 the oxide masking member 18a, silicon nitride masking member 16a, and the oxide layer 23 are removed employing known etchants. Following this the polycrystalline silicon layer 14 is subjected to an etchant which discriminates between the doped silicon region 29 and the surrounding undoped regions of the layer 14. The etchant etches only the undoped regions leaving the region 29a substantially unaffected. A hot KOH etchant may be employed for this purpose since it selectively etches the undoped silicon, leaving the boron doped silicon.

Figure 8:
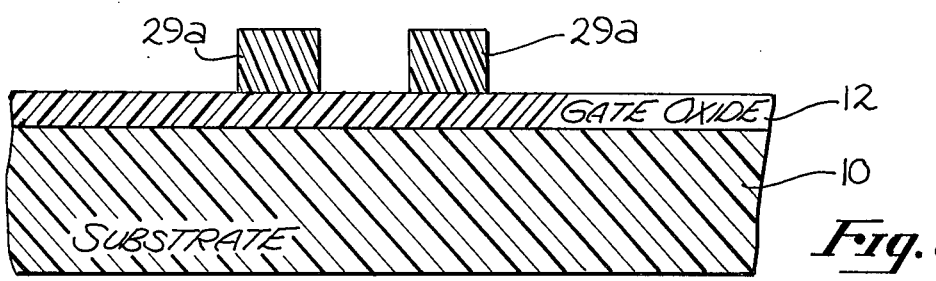
FIG. 8 illustrates the substrate of FIG. 7 after the polycrystalline silicon layer has been selectively etched.

Referring to FIG. 8 the region 29 of FIG. 7 is shown as structure 29a. For the described embodiment the structure 29a comprises a generally rectangular line, however, photolithographic techniques may be employed to define gates, interconnecting lines, or other circuit elements or members. Also, the structure 29a is of a p-type conductivity, however, this may be changed to an n-type conductivity where desired, again employing known techniques. For example, where an n-type structure is required, the structure 29a may be subjected to a phosphorus dopant at 950° C. This may be accomplished in a oxidizing atmosphere to seal the structure at this point of processing.

It will be appreciated that while the above described process employed a generally rectangular silicon nitride masking member over a coextensive polycrystalline silicon layer, resulting in a generally rectangular silicon line, other shapes may be readily fabricated with the disclosed process. By way of example, the polycrystalline silicon layer may be etched prior to the formation of the silicon nitride masking member, such that only a corner of the silicon nitride layer is disposed over the polycrystalline silicon layer. In this manner an L-shaped structure results. Other shapes, of course, may be similarly fabricated. Moreover, larger polycrystalline silicon structures may be simultaneously fabricated on other areas of the silicon layer 14. This may be accomplished, by way of example, by forming predetermined patterns in the oxide layer 23 shown in FIG. 4. This exposes areas of the silicon layer 14, spaced-apart from the silicon nitride masking means 16a. Then during the subsequent boron doping these exposed areas of the silicon layer 14 are doped with boron. When the layer 14 is selectively etched other structures corresponding to the predetermined patterns are thus formed. These patterns may be large in area (and width) when compared to the structure 29a.

Thus, a process has been disclosed which permits fabrication of narrow polycrystalline silicon structures. Unlike prior art processes for forming silicon structures, this process is substantially independent of masking tolerances and does not rely upon the width of a masking member to define a narrow polycrystalline silicon structure. Thus, the large tolerances (typically ±0.5 microns) inherent in current masks are not carried into the resultant polycrystalline silicon structure. Rather than being dependent upon the masking tolerances, the width of the structure is a function of the extent of diffusion from a line or point source which may be readily controlled by known means.

I claim:

1. A process for fabricating a polycrystalline silicon structure from a layer of polycrystalline silicon comprising the steps of:

forming a masking means on said polycrystalline silicon layer which exposes a line on said polycrystalline silicon layer delineated by an edge or periphery of said masking means;

doping a region of said polycrystalline silicon layer which includes said line on said layer, the dopant being introduced through said line such that said line acts as a line source for said dopant and such that the width of said region is a function of the extent of said doping and substantially independent of the width of said line, whereby said doped region is adjacent to undoped portions of said polycrystalline silicon layer;

removing said masking means;

subjecting said polycrystalline silicon layer to an etchant which discriminates between doped and undoped silicon such that undoped silicon is etched;

whereby a structure is fabricated from said polycrystalline silicon layer where the critical dimensions of said structure are substantially controlled by the extent of said doping introduced at said line, rather than the masking tolerances.

2. The process defined by claim 1 wherein said formation of said masking means includes the formation of a silicon nitride masking member on said polycrystalline silicon layer, which member is etched along an edge to form said exposed portion of said polycrystalline silicon layer.

3. The process defined by claim 2 including the formation of a silicon oxide on said polycrystalline silicon layer along an edge of said silicon nitride masking member before said masking member is etched such that after etching said masking member, said exposed portion of said polycrystalline silicon layer is defined by said etched edge of said masking member and an edge of said silicon oxide.

4. The process defined by claim 1 wherein said doping comprises the diffusion of boron into said polycrystalline silicon.

5. The process defined by claim 4 wherein said silicon layer is etched with a solution which includes KOH.

6. A process for forming a polycrystalline silicon member from a polycrystalline silicon layer comprising the steps of:

forming a masking means on said silicon layer, said masking means defining a gap which communicates with said silicon layer, said gap defined by an edge of said masking means;

diffusing an impurity into said silicon layer through said gap to define a doped region in said silicon layer, the width of said doped region being substantially determined by the extent of said diffusion and substantially independent of the width of said gap;

removing said masking means;

selectively etching said silicon layer such that silicon surrounding said doped region is removed;

whereby said doped region forms a polycrystalline silicon member.

7. The process defined by claim 6 wherein said doped region extends beyond the periphery of said gap.

8. A process for fabricating a polycrystalline silicon structure from a polycrystalline silicon layer comprising the steps of:

forming a masking member on said silicon layer;

forming a masking layer on said silicon layer at least adjacent to one edge of said masking member;

subjecting said masking member and masking layer to a etchant so as to etch said masking member or masking layer to form a gap between an edge of said masking member and said masking layer;

doping a region of said silicon layer through said gap, the width of said region being substantially determined by the extent of said doping and being substantially independent of the width of said gap;

removing said masking member and said masking layer;

etching said silicon layer such that said doped region remains, thereby forming a polycrystalline silicon structure;

whereby a polycrystalline silicon structure may be formed where the critical dimensions of said structure are controlled by doping and are not substantially dependent on masking tolerance.

9. The process defined by claim 8 wherein said doped region extends beyond the periphery of said gap.

10. The process defined by claim 9 wherein said masking layer comprises silicon oxide.

11. The process defined by claim 10 wherein said masking member comprises silicon nitride.

12. The process defined by claim 11 wherein said silicon nitride masking member is etched to form said gap.

13. The process defined by claim 12 wherein said doping step comprises the diffusion of boron into said silicon layer through said gap to define said doped region.

14. The process defined by claim 13 wherein said etching of said silicon layer comprises subjecting said silicon layer to KOH.

* * * * *

UNITED STATES PATENT OFFICE
CERTIFICATE OF CORRECTION

Patent No. 4,026,740     Dated May 31, 1977

Inventor(s) William H. Owen, III

It is certified that error appears in the above-identified patent and that said Letters Patent are hereby corrected as shown below:

Column 2, Lines 61 & 62:   "1000'λ '3000A" should read as --1000-3000A--.

Signed and Sealed this

Thirteenth Day of September 1977

[SEAL]

Attest:

RUTH C. MASON
*Attesting Officer*

LUTRELLE F. PARKER
*Acting Commissioner of Patents and Trademarks*